(12) United States Patent
Liu (10) Patent No.: US 8,309,453 B2
(45) Date of Patent: Nov. 13, 2012

(54) MULTILEVEL INTERCONNECTS STRUCTURE WITH SHIELDING FUNCTION AND FABRICATING METHOD THEREOF

(75) Inventor: Yan-Hsiu Liu, Tai-Nan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 991 days.

(21) Appl. No.: 11/668,436

(22) Filed: Jan. 29, 2007

(65) Prior Publication Data

US 2008/0179716 A1 Jul. 31, 2008

(51) Int. Cl.
*H01L 21/4763* (2006.01)

(52) U.S. Cl. ............... 438/622; 257/659; 257/E23.019

(58) Field of Classification Search .......... 257/435, 257/31.122, 659, 660, E31.001, E23.019, 257/E31.122, E21.627, 229, 232; 174/355, 174/394; 438/626, 731, 78, 622
See application file for complete search history.

(56) References Cited

U.S. PATENT DOCUMENTS

| | | | |
|---|---|---|---|
| 6,278,169 B1 * | 8/2001 | Sayuk et al. | 257/435 |
| 6,815,787 B1 | 11/2004 | Yaung | |
| 6,888,063 B1 * | 5/2005 | Lien et al. | 174/394 |
| 2005/0040500 A1 * | 2/2005 | Henmi | 257/659 |
| 2006/0060899 A1 * | 3/2006 | Hong et al. | 257/294 |
| 2007/0205354 A1 * | 9/2007 | Li | 250/208.1 |
| 2008/0032438 A1 * | 2/2008 | Wen et al. | 438/60 |

* cited by examiner

*Primary Examiner* — Matthew Landau
*Assistant Examiner* — Candice Chan
(74) *Attorney, Agent, or Firm* — Winston Hsu; Scott Margo (57) ABSTRACT

A method of fabricating multilevel interconnects includes providing a substrate having a pixel array area and a logical circuit area, forming a first dielectric layer on the substrate, performing a first metallizing process on the first dielectric layer to form a first patterned metal layer and a second patterned metal layer above the pixel array area and the logical circuit area respectively, forming a second dielectric layer on the first patterned metal layer, the second patterned metal layer, and the first dielectric layer, performing a second metallizing process on the second dielectric layer to form a third patterned metal layer and a fourth patterned metal layer above the pixel array area and the logical circuit area respectively, wherein patterns of the fourth and the second patterned metal layer interlace to completely cover the logical circuit area, and depositing a dielectric layer on the third and the fourth patterned metal layer.

25 Claims, 12 Drawing Sheets

MULTILEVEL INTERCONNECTS STRUCTURE WITH SHIELDING FUNCTION AND FABRICATING METHOD THEREOF

BACKGROUND OF THE INVENTION

1. Field of the Invention

The present invention relates to a structure of multilevel interconnects and a fabricating method thereof, and more particularly, to a method of fabricating a microlens with an etching process and a structure thereof.

2. Description of the Prior Art

CMOS image sensors (CISs) and charge-coupled devices (CCDs) are optical circuit components that represent light signals as digital signals. CISs and CCDs are used in the prior art. These two components are widely applied to many devices, including: scanners, video cameras, and digital still cameras. CCDs use is limited in the market due to price and the volume considerations. As a result, CISs enjoy greater popularity in the market.

The CIS is manufactured utilizing the prior art semiconductor manufacturing process. This process helps to decrease the cost and the component size. It is applied in digital products such as personal computer cameras such as Web cams and digital cameras. Currently, the CIS can be classified into two types: line type and plane type. The line type CIS is applied in scanners, and the plane type CIS is applied in digital cameras.

Figure 1:
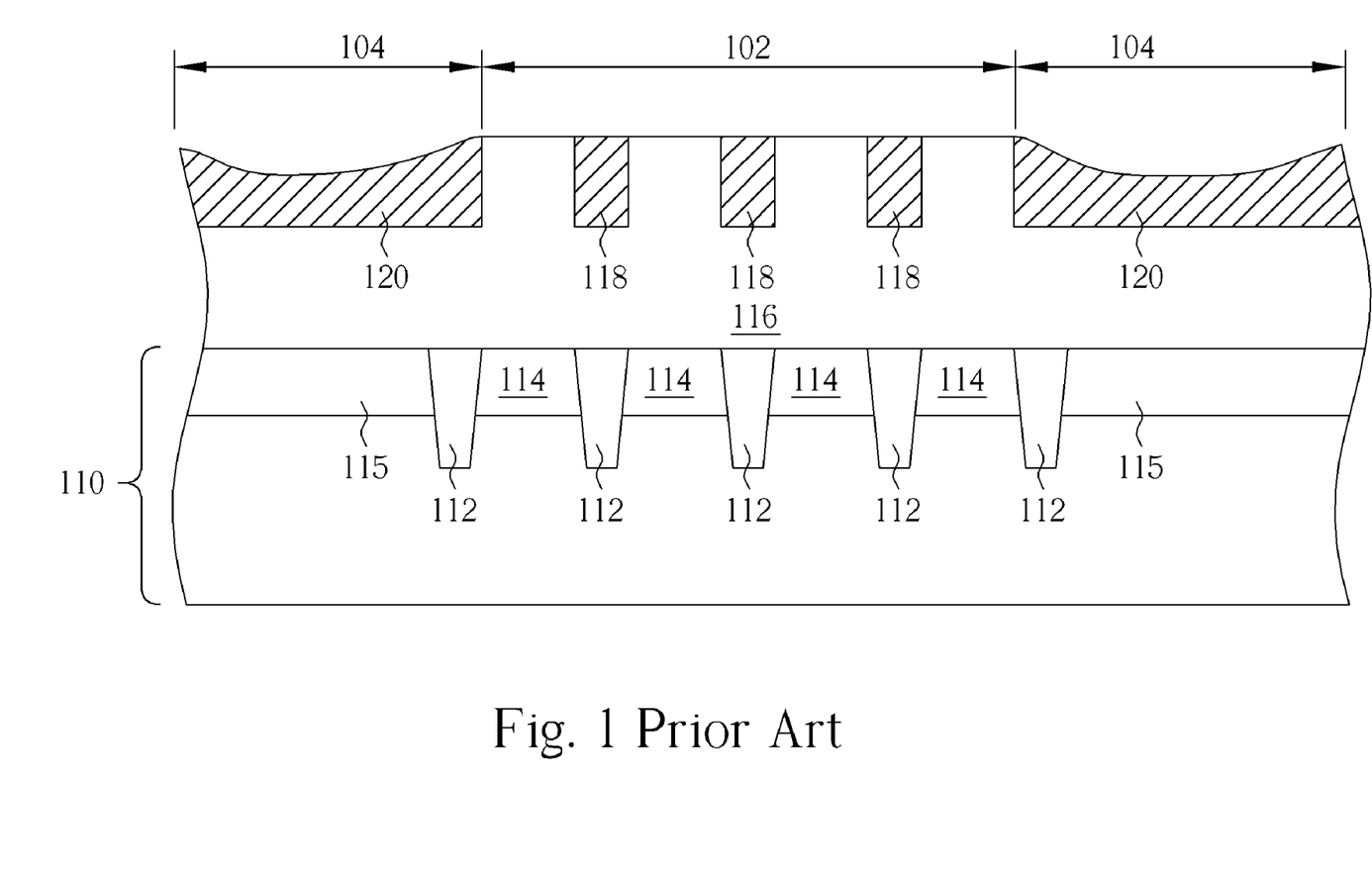
FIG. 1 to FIG. 2 show a multilevel interconnects structure of the CIS manufacturing process according to the prior art.
Figure 2:
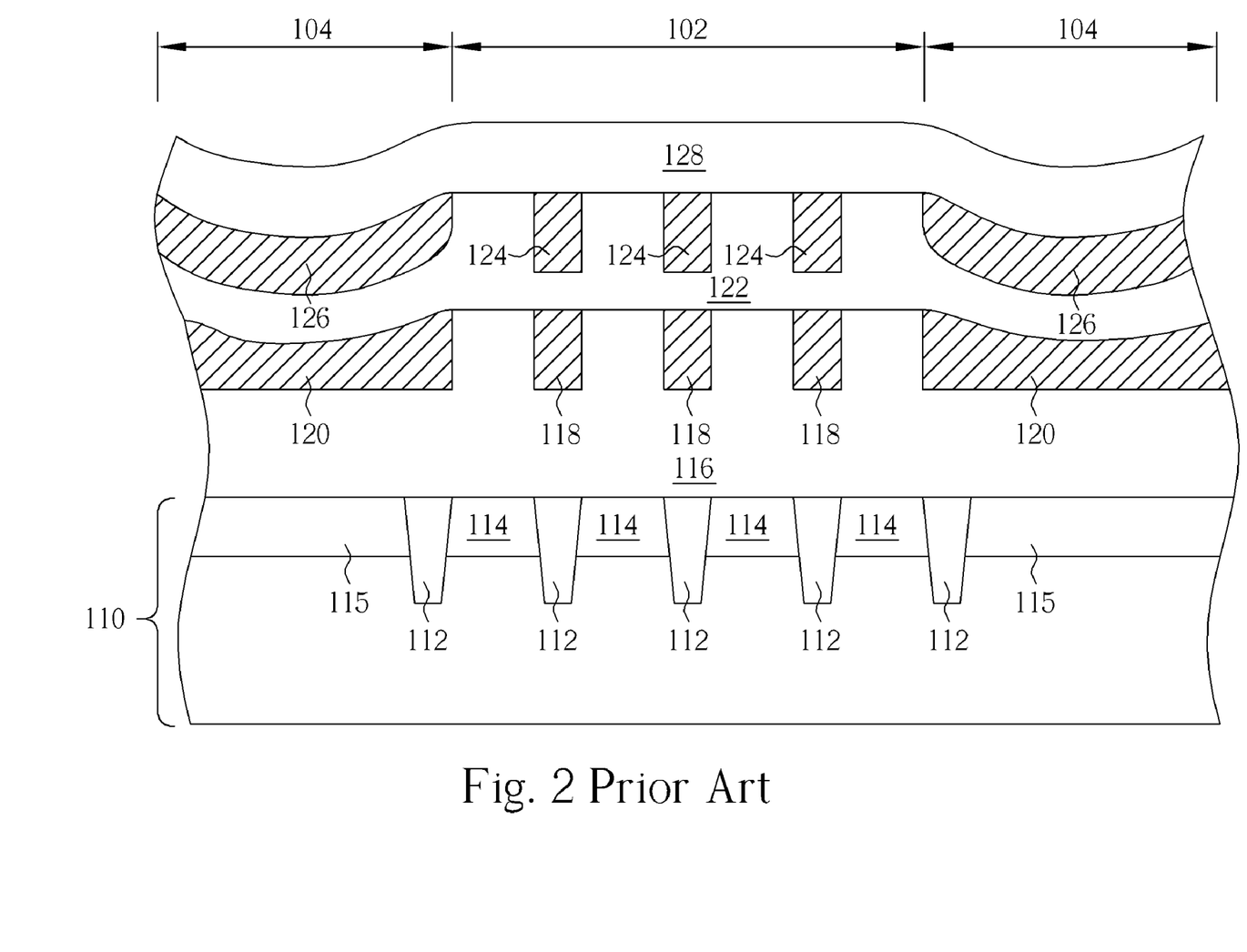

Please refer to FIG. 1 to FIG. 2. FIG. 1 to FIG. 2 show a multilevel interconnects structure of the CIS manufacturing process according to the prior art. As shown in FIG. 1, the conventional CIS includes a pixel array area 102 and a logical circuit area 104 respectively formed on the semiconductor substrate 110, and the pixel array area 102 includes a plurality of shallow trench isolations (STI) 112 and a plurality of photodiodes 114. The logical circuit area 104 includes a plurality of logical components 115. Each photodiode 114 connects electrically to at least one MOS transistor (not shown) such as a reset transistor, current source follower, and row selector. The STI 112 is an insulator between these two adjacent photodiodes 114 for preventing the photodiode 114 from shorting with other components.

An inter layer dielectric (ILD) layer 116 is formed on the semiconductor substrate 110 to cover the photodiodes 114 and the STIs 112, and then a metallization process is performed on the ILD layer 116 to form a first patterned metal layer 118 and a first shielding metal layer 120. The metallizing process includes etching the ILD layer 116, depositing a metal layer such as a copper metal layer on the ILD layer 116, and performing a planarization process such as a chemical mechanical polishing (CMP) process on the metal layer and the ILD layer 116 to form a first patterned metal layer 118 and a first shielding metal layer 120. Since a metal pattern with large superficial measure is always used as a shielding structure in the prior art for the first shielding metal layer 120, the first shielding metal layer 120 has a much greater pattern density than that of the first patterned metal layer 118, and after the planarization process, dishing will occur on the surface of the first shielding metal layer 120 due to the greater pattern density. The rugged and rough problems will also happen in a series of the metallizing processes and the planarization processes afterward, and the problems will become more serious when there are more metallizing processes and planarization processes afterward. As shown in FIG. 2, an inter metal dielectric (IMD) layer 122 is formed on the ILD layer 116, the first patterned metal layer 118, and the first shielding metal layer 120. Next, a second patterned metal layer 124 and a second shielding metal layer 126 are formed on the IMD layer 122, and finally a dielectric layer 128 is deposited on the second patterned metal layer 124 and the second shielding metal layer 126. Obviously, there is a serious rugged and rough problem between the pixel array area 102 and the logical circuit area 104.

SUMMARY OF THE INVENTION

An object of the present invention is to provide a structure of multilevel interconnects and a fabricating method thereof, and more particularly, to a structure of multilevel interconnects using interlacing design and a fabricating method thereof in order to solve the limitations and problems of the prior art.

According to the claims, the present invention provides a method of fabricating multilevel interconnects with shielding function comprising providing a substrate, a pixel array area and a logical circuit area defined on the substrate surface, forming a first dielectric layer on the substrate, performing a first metallizing process on the first dielectric layer to form a first patterned metal layer and a second patterned metal layer above the pixel array area and the logical circuit area respectively, forming a second dielectric layer on the first patterned metal layer, the second patterned metal layer, and the first dielectric layer, performing a second metallizing process on the second dielectric layer to form a third patterned metal layer and a fourth patterned metal layer above the pixel array area and the logical circuit area respectively, patterns of the fourth patterned metal layer and the second patterned interlacing to completely cover the logical circuit area, and depositing a planarized dielectric layer on the third patterned metal layer and the fourth patterned metal layer.

According to the claims, the present invention further provides a structure of multilevel interconnects with shielding function comprising a substrate with a pixel array area and a logical circuit area on the substrate surface, a first dielectric layer positioned on the substrate, a first patterned metal layer positioned on the first dielectric layer and above the pixel array area on the substrate surface, a second patterned metal layer positioned on the first dielectric layer and above the logical circuit area on the substrate surface, a second dielectric layer positioned on the first patterned metal layer, the second patterned metal layer, and the first dielectric layer, a third patterned metal layer positioned on the second dielectric layer and above the pixel array area on the substrate surface, a fourth patterned metal layer positioned on the second dielectric layer and above the logical circuit area on the substrate surface, patterns of the fourth patterned metal layer and the second patterned interlaced to completely cover the logical circuit area, and a planarized dielectric layer positioned on the third patterned metal layer and the fourth patterned metal layer.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
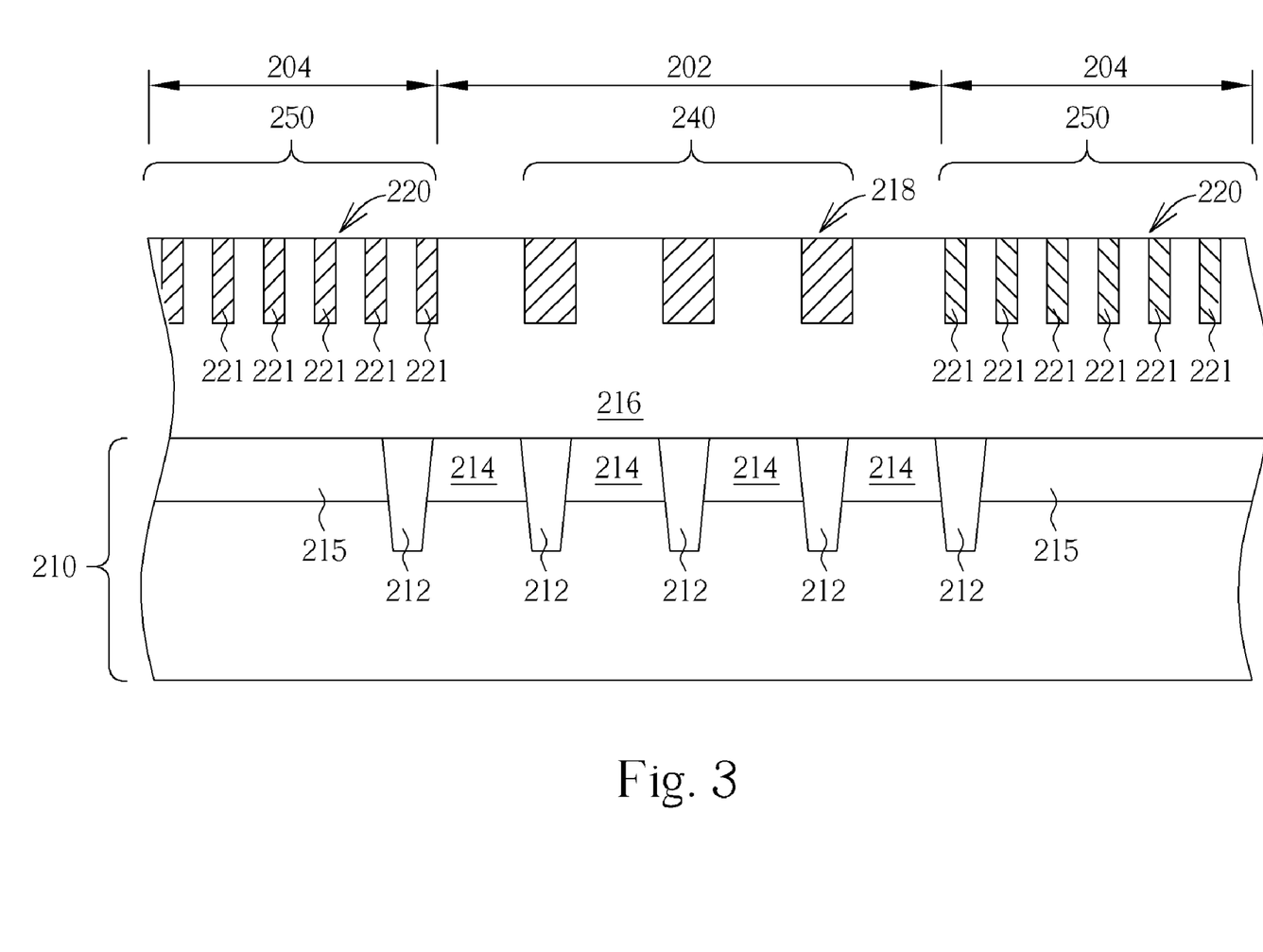
FIG. 3 to FIG. 5 show schematic, cross-sectional diagrams illustrating a fabricating method of multilevel interconnects in accordance with the first preferred embodiment of the present invention.
Figure 4:
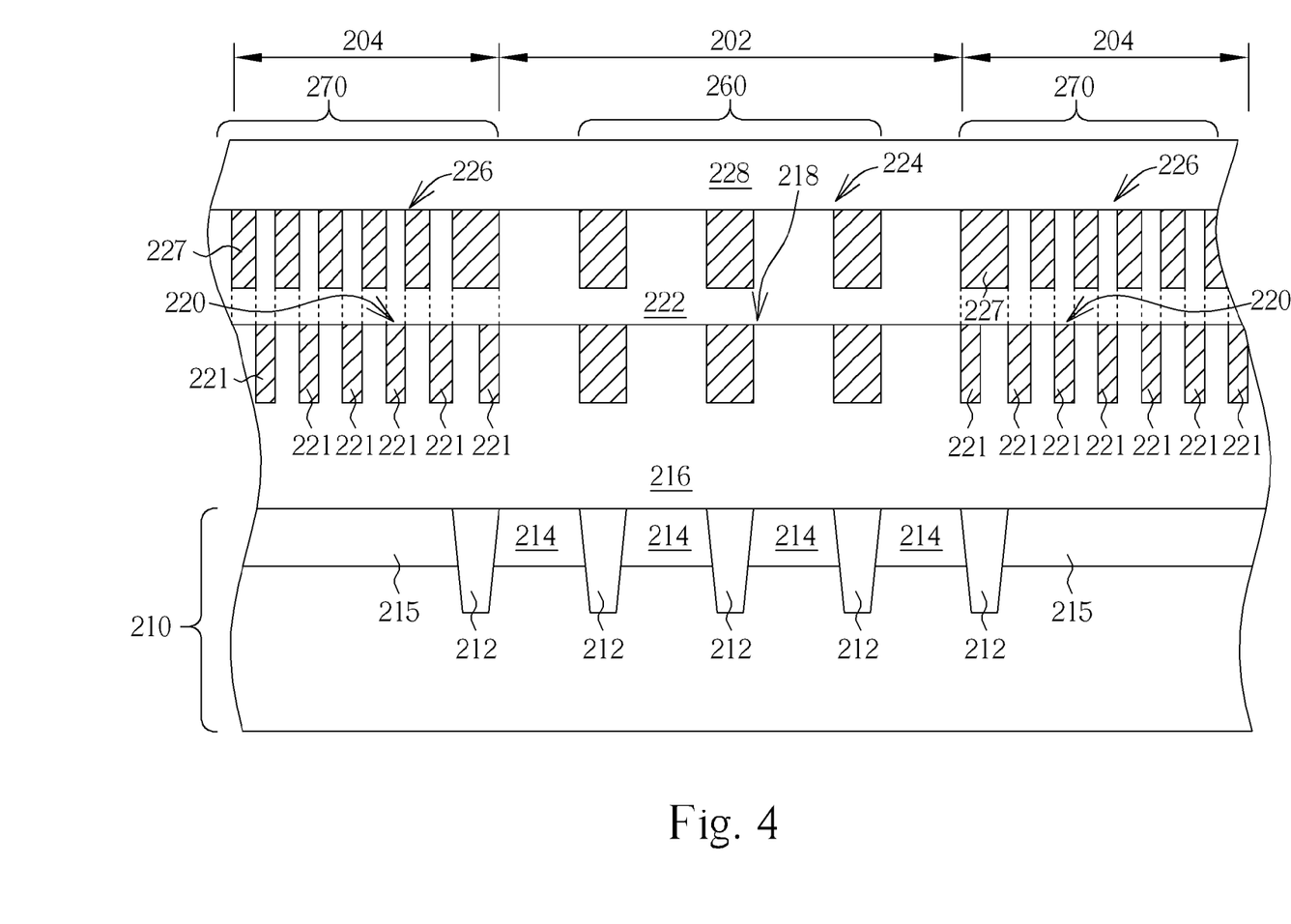
Figure 5:
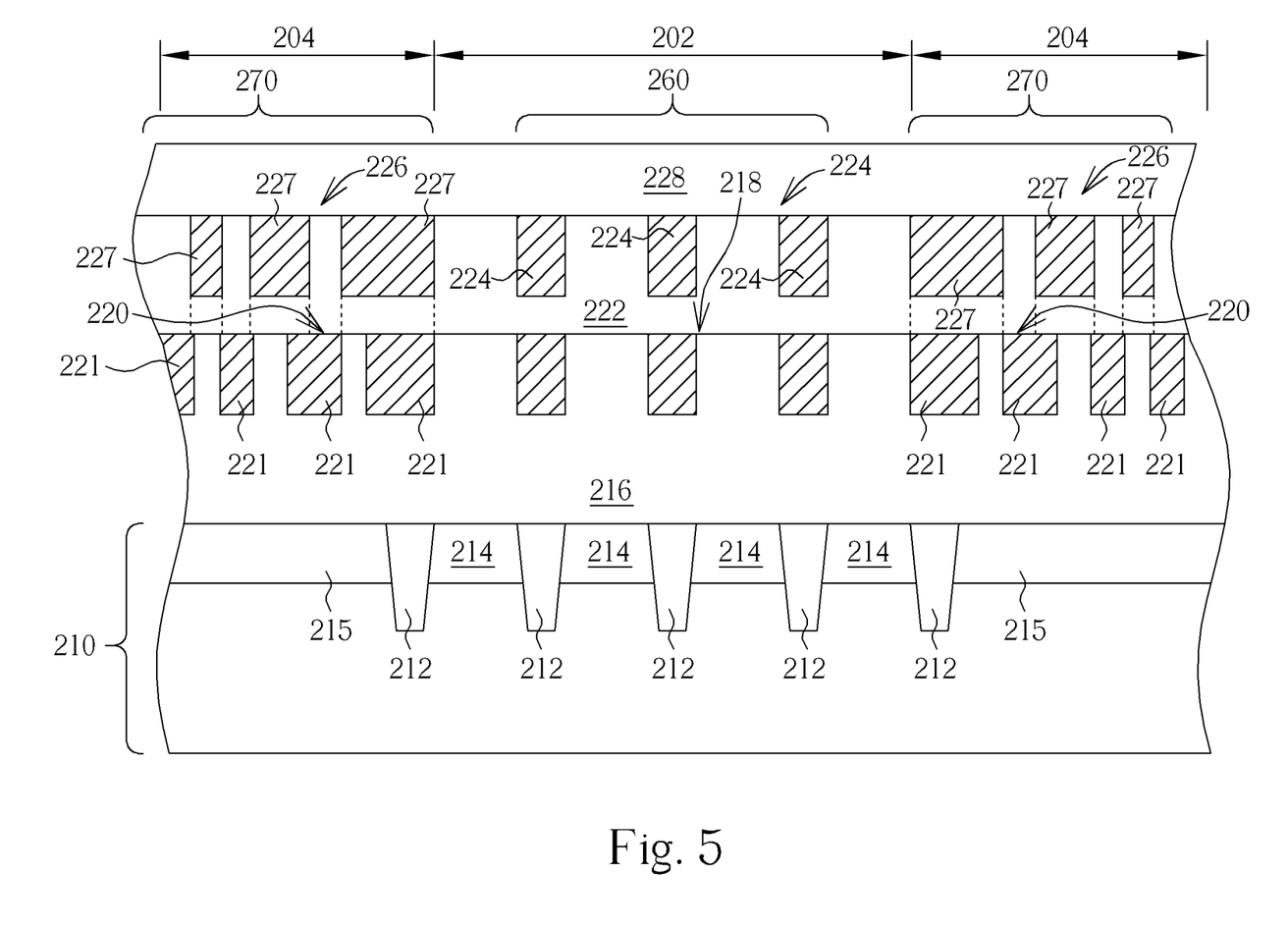

Please refer to FIG. 3 to FIG. 5. FIG. 3 to FIG. 5 show schematic, cross-sectional diagrams illustrating a fabricating method of multilevel interconnects in accordance with the first preferred embodiment of the present invention. As shown in FIG. 3, the present invention first provides a substrate 210, and the substrate 210 has a pixel array area 202 and a logical circuit area 204 on the surface. The substrate 210 is a semiconductor substrate, but is not limited to a silicon wafer or a SOI, and the pixel array area 202 may include a plurality of light sensitization devices 214 such as photodiodes, etc., to receive the outside light beams and sensor the light intensity, and a plurality of insulators 212 such as shallow trench isolations (STIs), or local oxidation of silicon isolation layers (LOCOSs), etc., to avoid shorts and contact of the light sensitization devices 214 with MOS transistors and other devices. The light sensitization devices 214 are further electrically connected to CMOS transistors (not shown) such as reset transistors, current source followers, or row selectors. The logical circuit area 204 may include a plurality of logical components 215.

Next, a first dielectric layer 216 such as an ILD layer including silicon oxide compounds is formed on the substrate 210, and a first metallizing process is performed on the first dielectric layer 216 to form a first patterned metal layer 218 and a second patterned metal layer 220 above the pixel array area 202 and the logical circuit area 204 respectively. The first metallizing process may be a damascene process of copper or aluminum, etc, for example, performing an etching process first to dry etch or wet etch the first dielectric layer 216 to form a first pattern area 240 and a second pattern area 250 with via etching pattern or trench etching pattern in the first dielectric layer 216 above the pixel array area 202 and the logical circuit area 204 respectively, next, forming a first metal layer (not shown) on the first dielectric layer, for example, using a chemical vapor deposition (CVD) process, a physical vapor deposition (PVD) process, a coating process, or an electroplating process to form a copper metal layer or an aluminum metal layer, and then performing a first planarization process such as a CMP process or an etching process on the first metal layer and the first dielectric layer 216 to form a first patterned metal layer 218 and a second patterned metal layer 220 on the first pattern area 240 and the second pattern area 250 respectively, wherein the pattern of the second patterned metal layer 220 has a plurality of first blocks 221.

Then, as shown in FIG. 4, a second dielectric layer 222 such as an IMD layer is formed on the first patterned metal layer 218, the second patterned metal layer 220, and the first dielectric layer 216 by using a CVD process for example, and then a second metallizing process is performed on the second dielectric layer 222 to form a third patterned metal layer 224 and a fourth patterned metal layer 226 above the pixel array area 202 and the logical circuit area 204 respectively, wherein the patterned of the fourth patterned metal layer 226 has a plurality of second blocks 227. The second metallizing process also may be a damascene process of copper or aluminum, etc, for example, performing an etching process first to dry etch or wet etch the second dielectric layer 222 to form a third pattern area 260 and a fourth pattern area 270 with via etching pattern or trench etching pattern in the second dielectric layer 222 above the pixel array area 202 and the logical circuit area 204 respectively, next, forming a second metal layer (not shown) on the second dielectric layer, for example, using a chemical vapor deposition (CVD) process, a physical vapor deposition (PVD) process, a coating process, or an electroplating process to form a copper metal layer or an aluminum metal layer, and then performing a first planarization process such as a CMP process or an etching process on the second metal layer and the second dielectric layer 222 to form a third patterned metal layer 224 and a fourth patterned metal layer 226 on the third pattern area 260 and the fourth pattern area 270 respectively. Finally, a planarized dielectric layer 228 is deposited on the third patterned metal layer 224 and the fourth patterned metal layer 226.

Please note that the first patterned metal layer and the second patterned metal layer have the same pattern density or similar pattern density, and the third patterned metal layer and the fourth patterned metal layer have the same pattern density or similar pattern density in the first preferred embodiment of the present invention. The pattern density is defined as the area occupied by the patterned metal layer divided by the total area in that region to be shielded by the patterned metal layer when viewed from the top looking down. Every patterned metal layer does not have a metal pattern with large superficial measure, and therefore, the rugged and rough problems can be prevented during a series of the metallizing processes and the planarization processes, and even when there are more metallizing processes and planarization processes afterward, the present invention multilevel interconnects still has a flat surface. Furthermore, patterns of the fourth patterned metal layer 226 and the second patterned metal layer 220 are interlacing, and designed to stack and form a patterned metal layer with greater pattern density above the logical circuit area 204 as a shielding layer, and the logical circuit area 204 on the semiconductor substrate 220 is completely covered by the vertical projection superficial measure of the patterns of the fourth patterned metal layer 226 and the second patterned metal layer 220, wherein the patterns of the second patterned metal layer 220 and the fourth patterned metal layer 226 are interlaced without overlapping or interlaced and partially overlapping. The first patterned metal layer 218 and the third patterned metal layer 224 are completely overlapped to cover the insulators 212 entirely and expose the light sensitization devices 214 only. In addition, considering other better light shielding effects, as shown in FIG. 5, the patterns of the fourth patterned metal layer 226 and the second patterned metal layer 220 also can be designed as being dense inside and sparse outside, i.e. the patterns of the fourth patterned metal layer 226 and the second patterned metal layer 220 close to the pixel array area 202 have higher pattern density, and the patterns of the fourth patterned metal layer 226 and the second patterned metal layer 220 far from the pixel array area 202 have lower pattern density, or, the patterns of the fourth patterned metal layer 226 and the second patterned metal layer 220 close to the pixel array area 202 can be interlaced and partially overlapping, and the patterns of the fourth patterned metal layer 226 and the second patterned metal layer 220 far from the pixel array area 202 can be interlaced without overlapping, in order to attain a better light shielding effect.

Figure 6:
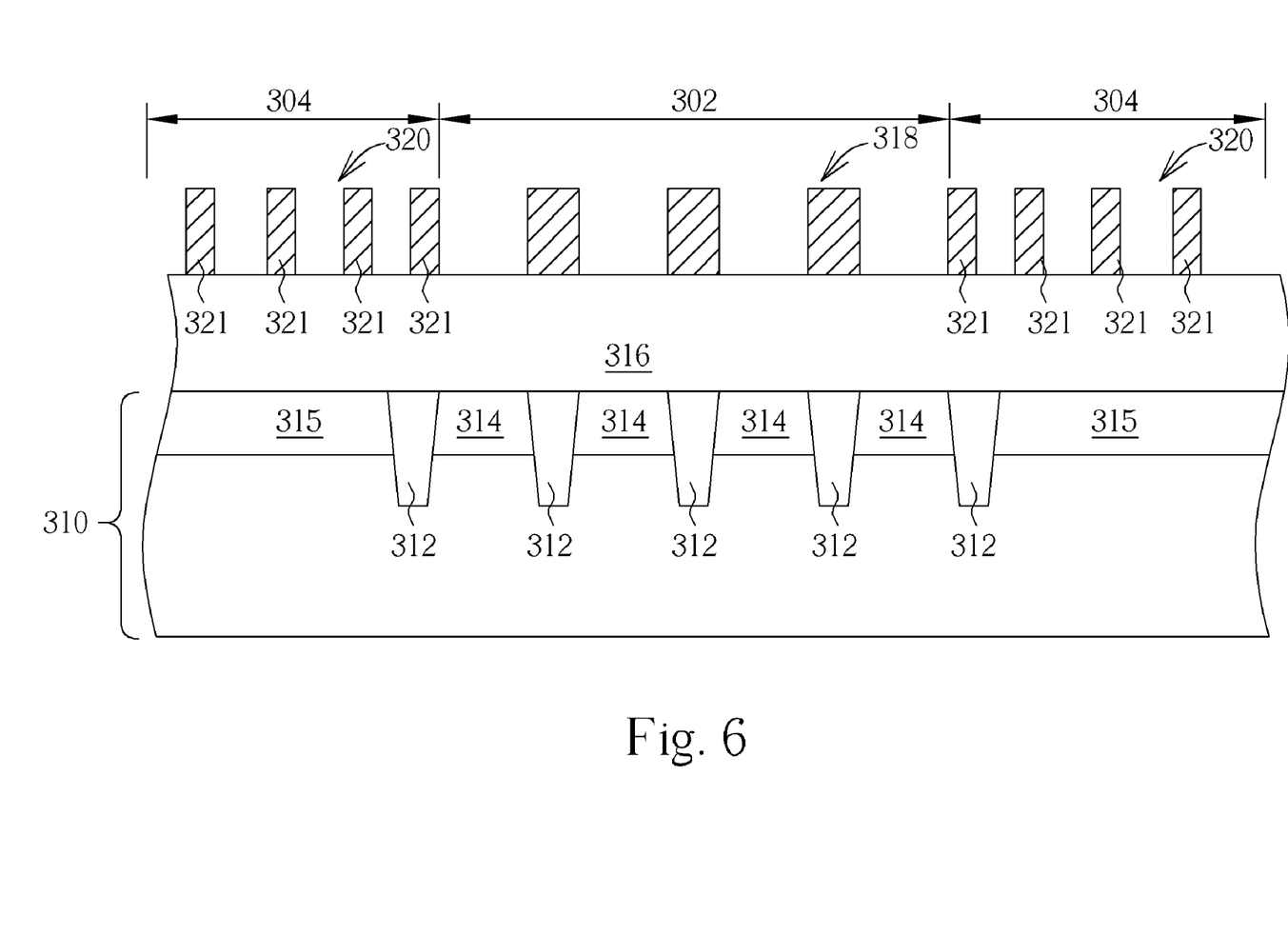
FIG. 6 to FIG. 9 show schematic, cross-sectional diagrams illustrating a fabricating method of multilevel interconnects in accordance with the second preferred embodiment of the present invention.

Please refer to FIG. 6 to FIG. 9. FIG. 6 to FIG. 9 show schematic, cross-sectional diagrams illustrating a fabricating method of multilevel interconnects in accordance with the second preferred embodiment of the present invention. As shown in FIG. 6, the present invention first provides a substrate 310, and the substrate 310 has a pixel array area 302 and a logical circuit area 304 on the surface. The logical circuit area 304 includes a plurality of logical components 315. Same as with the first preferred embodiment, the substrate 310 also may include a plurality of light sensitization devices 314, CMOS transistors (not shown), and a plurality of insulators 312, etc. Next, a first dielectric layer 316 such as an ILD layer including silicon oxide compounds is formed on the substrate 310, and a first metallizing process is performed on the first dielectric layer 316 to form a first patterned metal layer 318 and a second patterned metal layer 320 above the pixel array area 302 and the logical circuit area 304 respectively. The first metallizing process may be an etching process for metal such as aluminum, or alloy of aluminum and copper, etc., for example, forming a first metal layer (not shown) on the first dielectric layer 316, for example, using a CVD process, a PVD process, or a coating process to form an aluminum metal layer or an alloy layer of aluminum and copper, and then etching the first metal layer to form a first patterned metal layer 318 and a second patterned metal layer 320 above the first dielectric layer 316 of the pixel array area 302 and the logical circuit area 304 respectively, wherein the pattern of the second patterned metal layer 320 has a plurality of first blocks 321.

Figure 7:
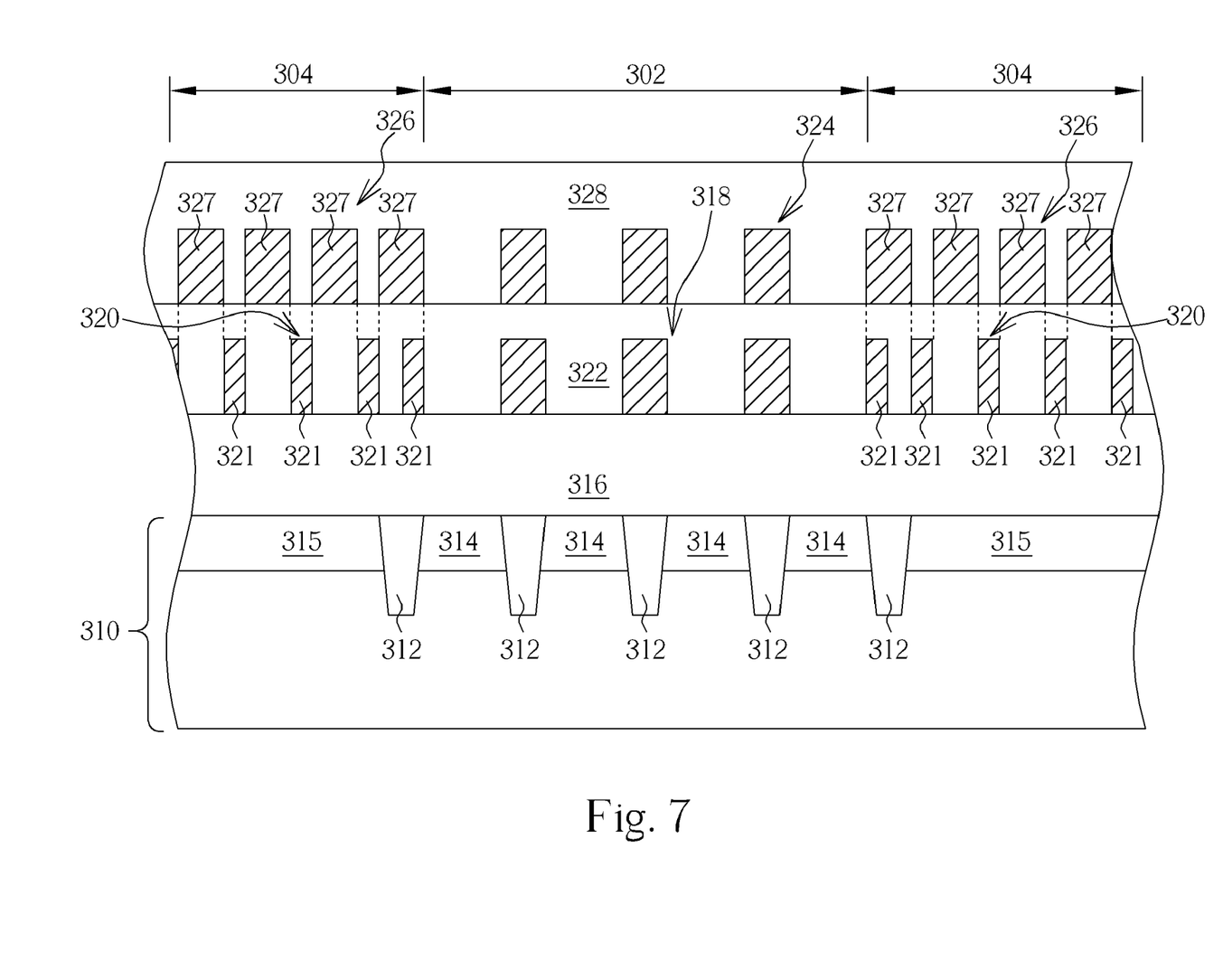

Then, as shown in FIG. 7, a second dielectric layer 322 such as an IMD layer is formed on the first patterned metal layer 318, the second patterned metal layer 320, and the first dielectric layer 316, and next, a first planarization process such as a CMP process or an etching process is performed on the second dielectric layer 322, and then the second metallizing process is performed to form a third patterned metal layer 324 and a fourth patterned metal layer 326 above the pixel array area 302 and the logical circuit area 304 respectively, wherein the patterned of the fourth patterned metal layer 326 has a plurality of second blocks 327. The second metallizing process may be an etching process for metal such as aluminum, or alloy of aluminum and copper, etc., for example, forming a second metal layer (not shown) on the second dielectric layer 322, for example, using a CVD process, a PVD process, or a coating process to form an aluminum metal layer or an alloy layer of aluminum and copper, and then etching the second metal layer to form a third patterned metal layer 324 and a fourth patterned metal layer 326 above the second dielectric layer 322 of the pixel array area 302 and the logical circuit area 304 respectively. Finally, a planarized dielectric layer 328 is deposited on the third patterned metal layer 324 and the fourth patterned metal layer 326.

Same as with the first preferred embodiment, please note that the first patterned metal layer 318 and the second patterned metal layer 320 have the same pattern density or similar pattern density, and the third patterned metal layer 324 and the fourth patterned metal layer 326 have the same pattern density or similar pattern density in the second preferred embodiment of the present invention. Every patterned metal layer does not have a metal pattern with large superficial measure, and therefore, the rugged and rough problems can be prevented during a series of the metallizing processes and the planarization processes, and even when there are more metallizing processes and planarization processes afterward, the present invention multilevel interconnects still has a flat surface. Furthermore, patterns of the fourth patterned metal layer 326 and the second patterned metal layer 320 are interlacing, and are designed to stack and form a patterned metal layer with greater pattern density above the logical circuit area 304 as a shielding layer, and the logical circuit area 304 on the semiconductor substrate 320 is completely covered by the vertical projection superficial measure of the patterns of the fourth patterned metal layer 326 and the second patterned metal layer 320, wherein the patterns of the second patterned metal layer 320 and the fourth patterned metal layer 326 are interlaced without overlapping or interlaced and partially overlapping. The first patterned metal layer 318 and the third patterned metal layer 324 are completely overlapped to cover the insulators 312 entirely and expose the light sensitization devices 314 only.

Figure 8:
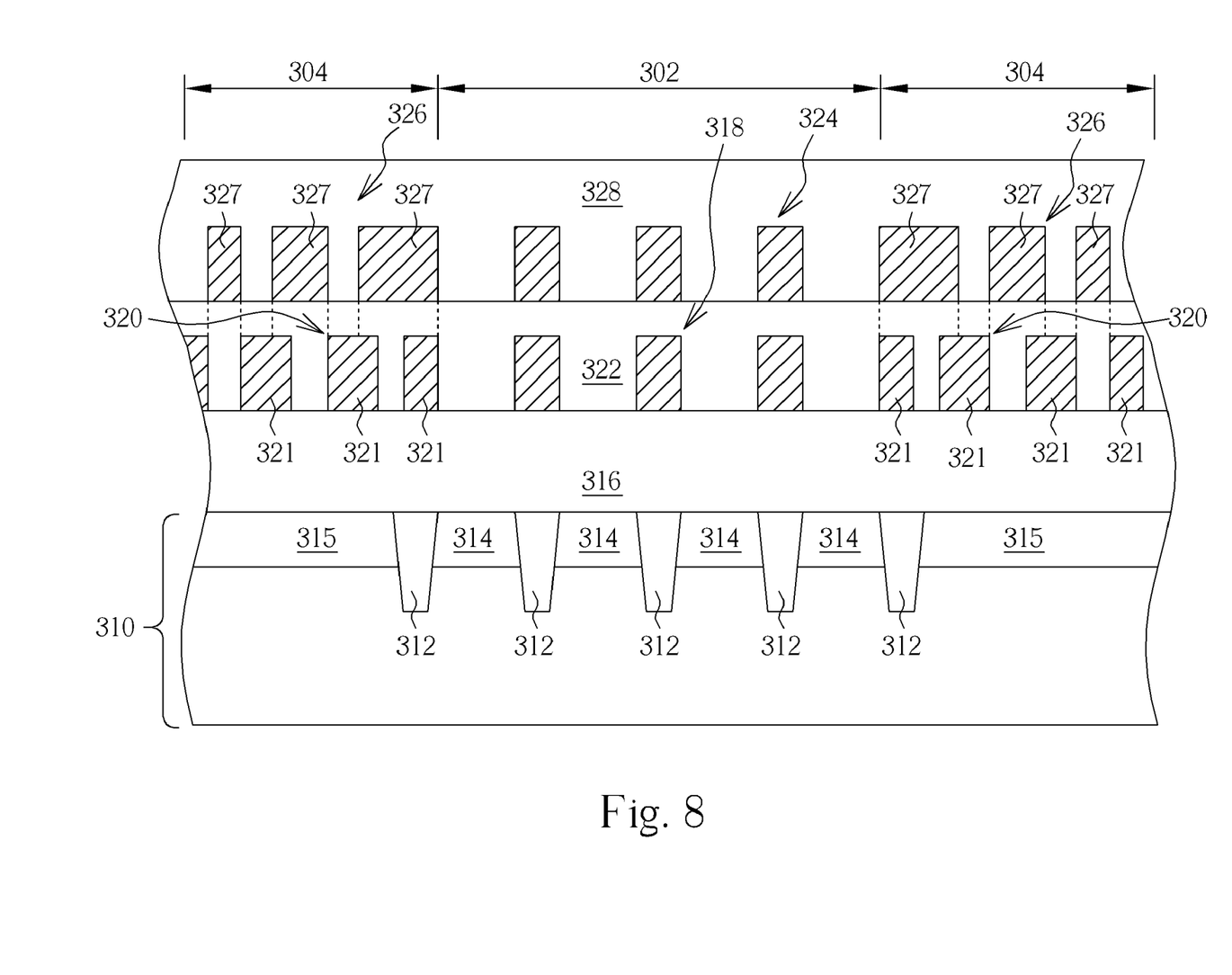

In addition, considering other better light shielding effects, as shown in FIG. 8, the patterns of the fourth patterned metal layer 326 and the second patterned metal layer 320 also can be designed as being dense inside and sparse outside, i.e. the patterns of the fourth patterned metal layer 326 and the second patterned metal layer 320 close to the pixel array area 302 have higher pattern density, and the patterns of the fourth patterned metal layer 326 and the second patterned metal layer 320 far from the pixel array area 302 have lower pattern density, or, the patterns of the fourth patterned metal layer 326 and the second patterned metal layer 320 close to the pixel array area 302 can be interlaced and partially overlapping, and the patterns of the fourth patterned metal layer 326 and the second patterned metal layer 320 far from the pixel array area 302 can be interlaced without overlapping, in order to attain a better light shielding effect.

Figure 9:
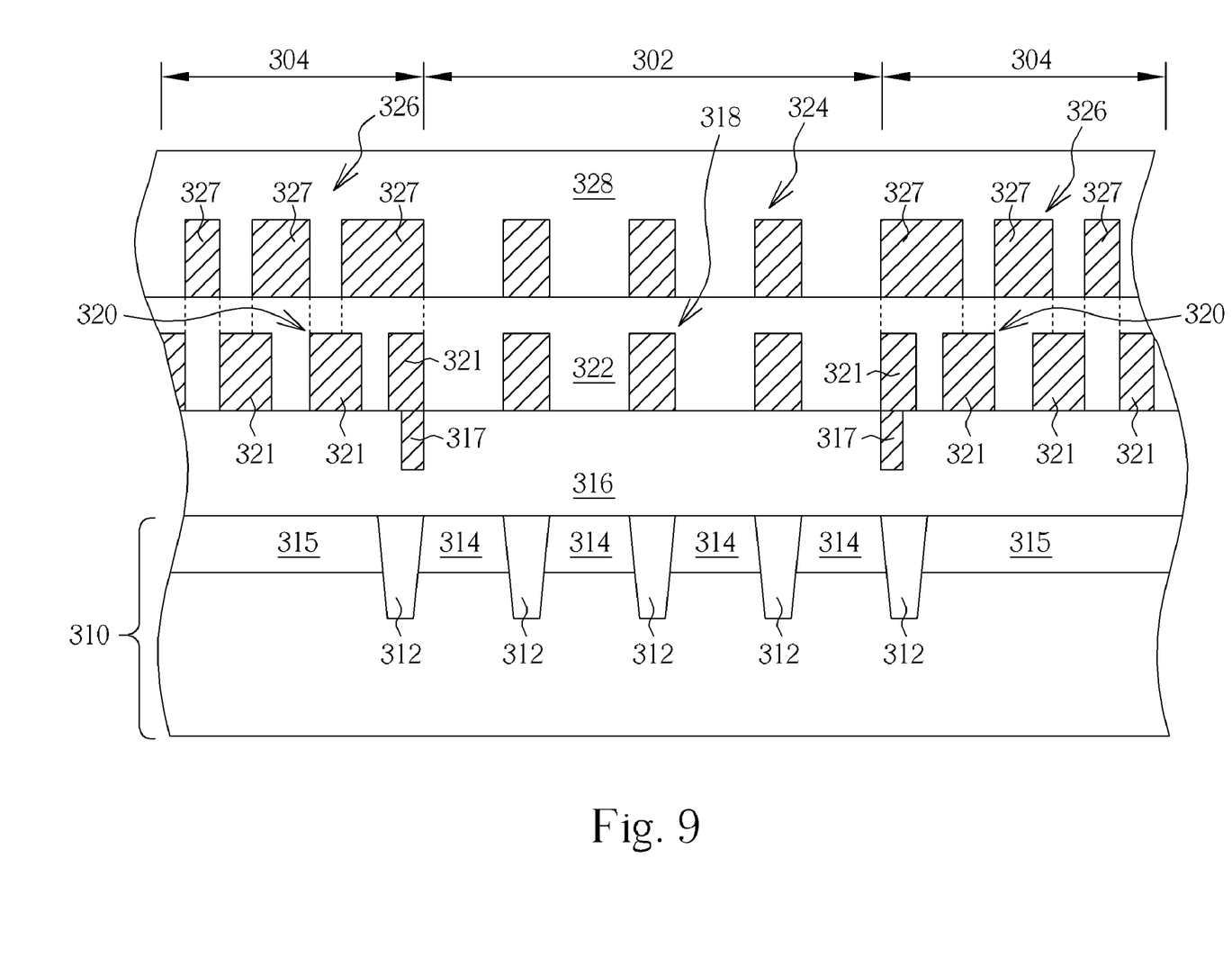

Furthermore, as shown in FIG. 9, when the first dielectric layer 316 is deposited on the substrate 310 in this second preferred embodiment, a via hole (not shown) can be further fabricated in the first dielectric layer 316, and a metal plug 317 can be formed when the first metal layer is formed, and the metal plug 317 can provide a better light shielding effect obviously.

Figure 10:
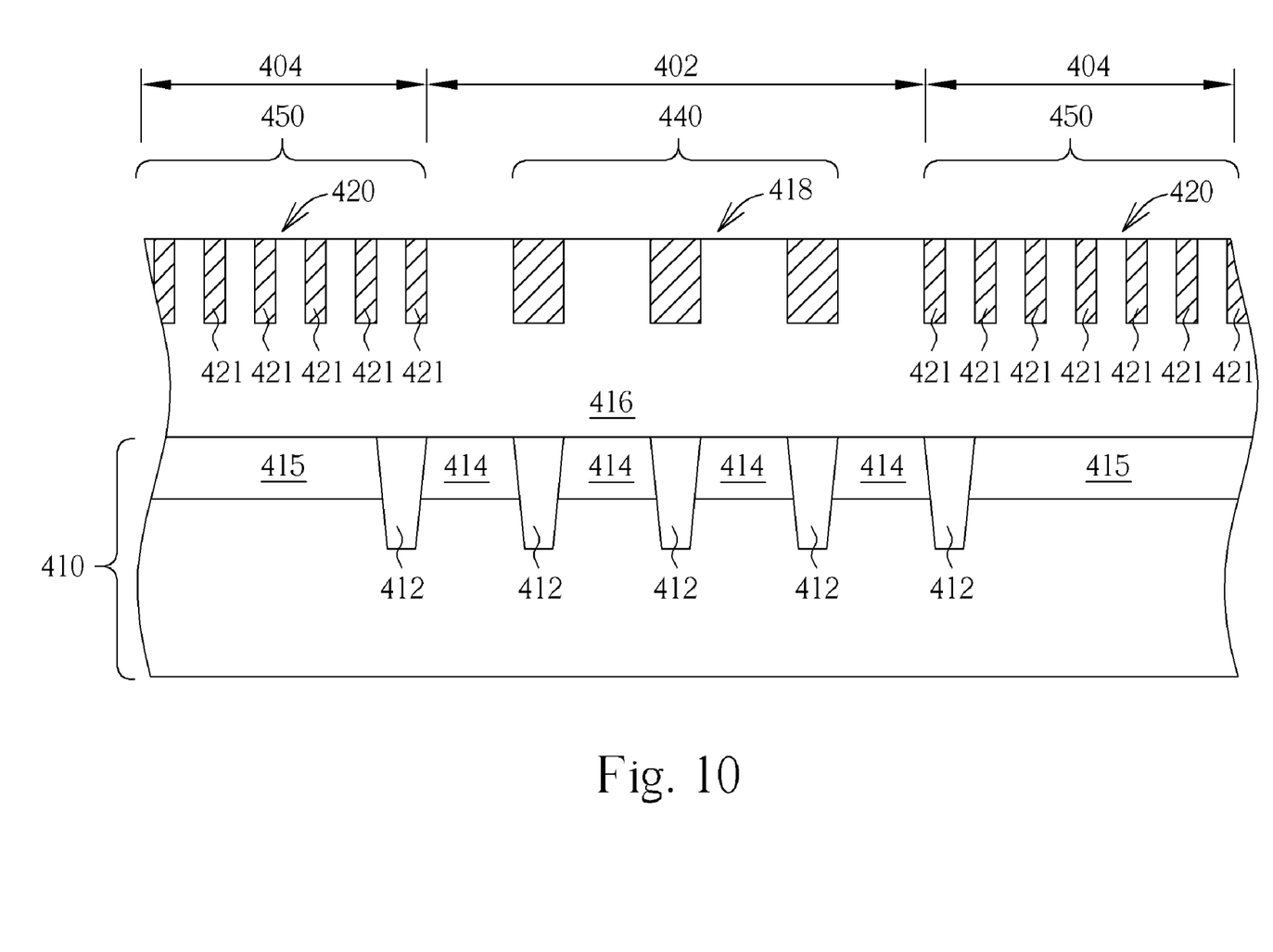
FIG. 10 to FIG. 12 show schematic, cross-sectional diagrams illustrating a fabricating method of multilevel interconnects in accordance with the third preferred embodiment of the present invention.
Figure 11:
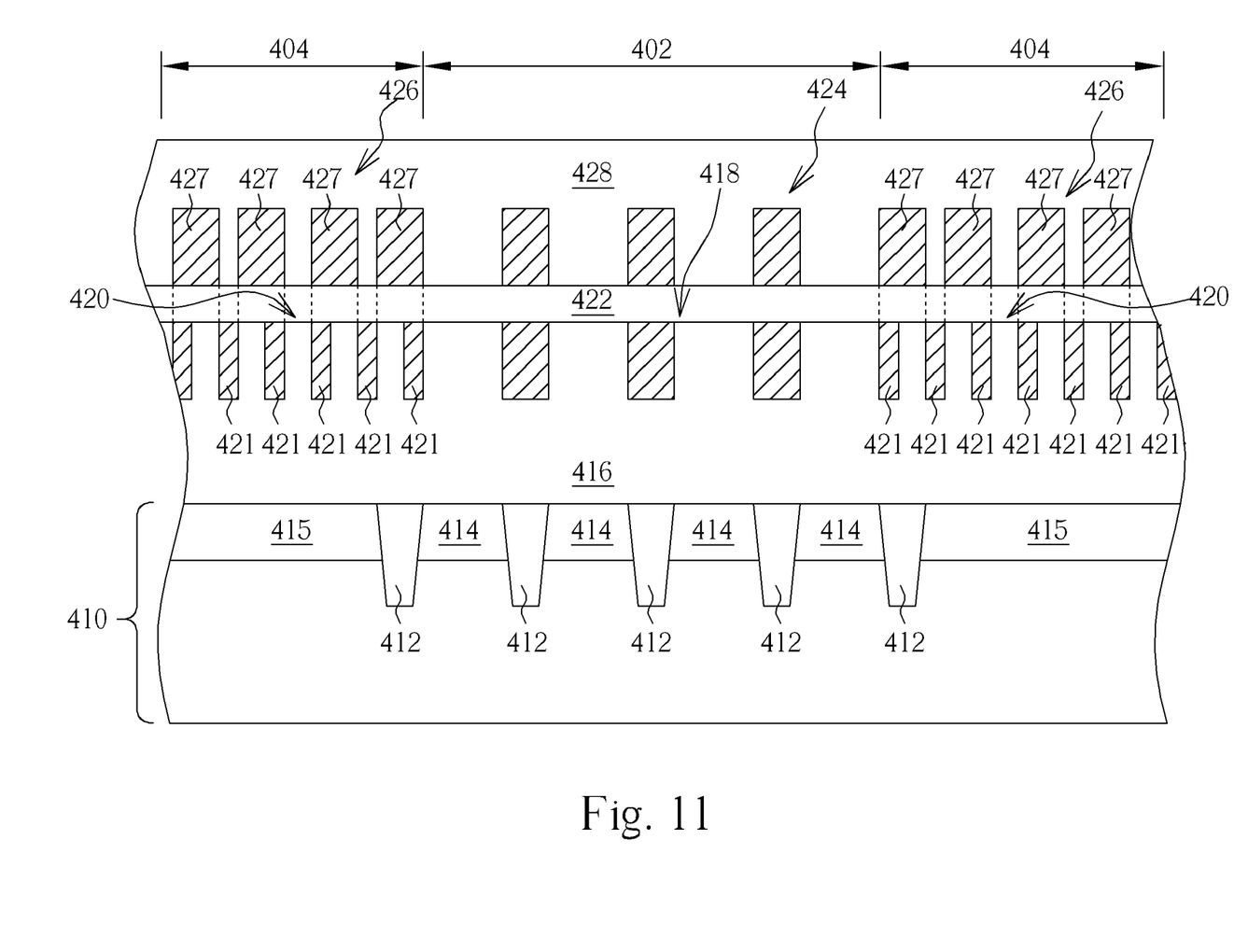
Figure 12:
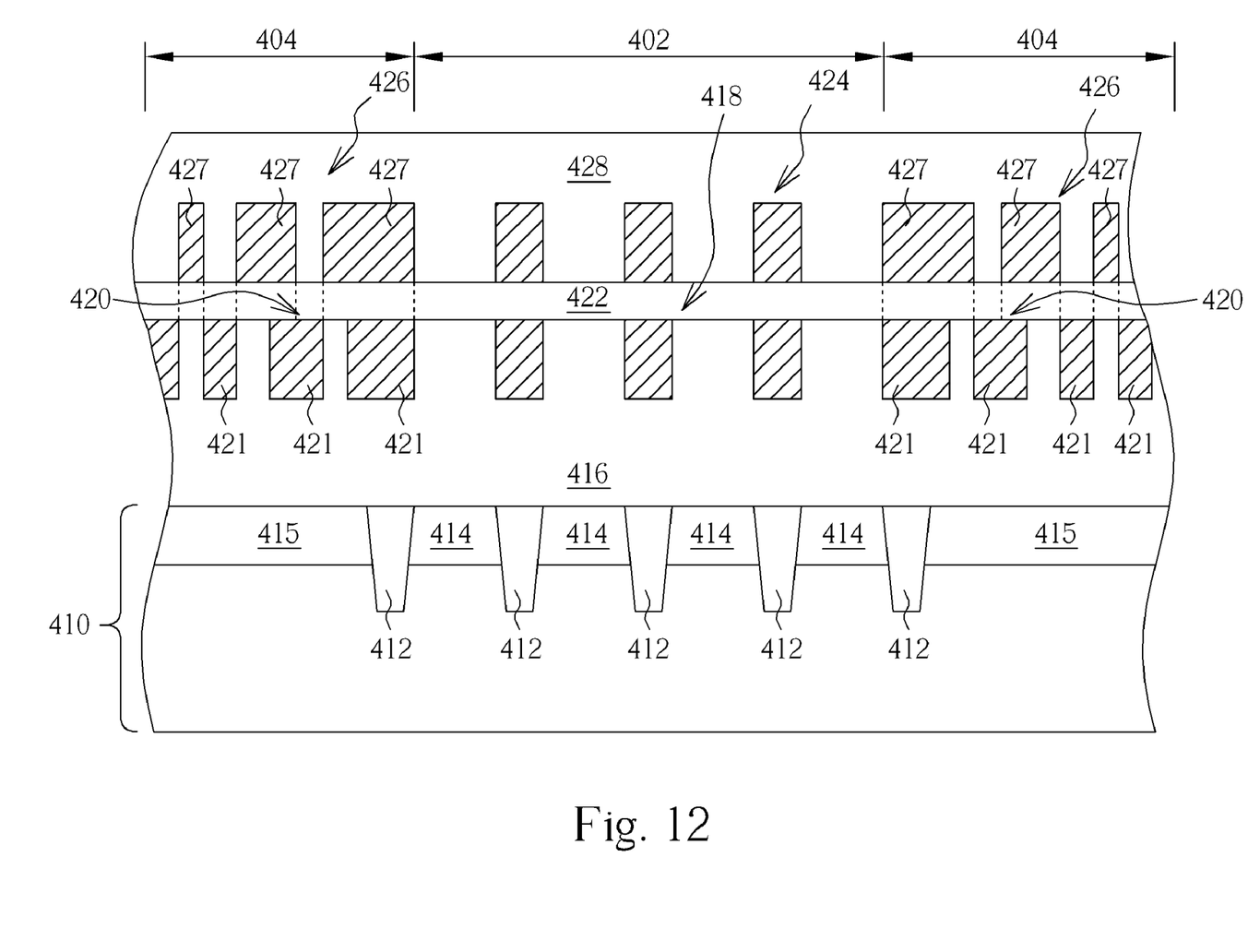

Please refer to FIG. 10 to FIG. 12. FIG. 10 to FIG. 12 show schematic, cross-sectional diagrams illustrating a fabricating method of multilevel interconnects in accordance with the third preferred embodiment of the present invention. As shown in FIG. 10, the present invention first provides a substrate 410, and the substrate 410 has a pixel array area 402 and a logical circuit area 404 on the surface. The logical circuit area 404 includes a plurality of logical components 415. Same as with the first and the second preferred embodiments, the substrate 410 also may include a plurality of light sensitization devices 414, CMOS transistors (not shown), and a plurality of insulators 412, etc. Next, a first dielectric layer 416 such as an ILD layer including silicon oxide compounds is formed on the substrate 410, and a first metallizing process is performed on the first dielectric layer 416 to form a first patterned metal layer 418 and a second patterned metal layer 420 above the pixel array area 402 and the logical circuit area 404 respectively. The first metallizing process may be an damascene process of copper or aluminum, etc, for example, performing an etching process first to dry etch or wet etch the first dielectric layer 416 to form a first pattern area 440 and a second pattern area 450 with via etching pattern or trench etching pattern in the first dielectric layer 416 above the pixel array area 402 and the logical circuit area 404 respectively, next, forming a first metal layer (not shown) on the first dielectric layer, for example, using a CVD process, a PVD process, a coating process, or an electroplating process to form a copper metal layer or an aluminum metal layer, and then performing a first planarization process such as a CMP process or an etching process on the first metal layer and the first dielectric layer 416 to form a first patterned metal layer 418 and a second patterned metal layer 420 on the first pattern area 440 and the second pattern area 450 respectively, wherein the pattern of the second patterned metal layer 420 has a plurality of first blocks 421.

Then, as shown in FIG. 11, a second dielectric layer 422 such as an IMD layer is formed on the first patterned metal layer 418, the second patterned metal layer 420, and the first dielectric layer 416 by using a CVD process for example, and then the second metallizing process is performed to form a third patterned metal layer 424 and a fourth patterned metal layer 426 above the pixel array area 402 and the logical circuit area 404 respectively, wherein the patterned of the fourth patterned metal layer 426 has a plurality of second blocks 427. The second metallizing process may be an etching process for metal such as aluminum, or alloy of aluminum and copper, etc., for example, forming a second metal layer (not shown) on the second dielectric layer 422, for example, using a CVD process, a PVD process, or a coating process to form an aluminum metal layer, and then performing an etching process such as a dry etching process or a wet etching process to etch the second metal layer to form a third patterned metal layer 424 and a fourth patterned metal layer 426 above the second dielectric layer 422 of the pixel array area 402 and the logical circuit area 404 respectively. Finally, a planarized dielectric layer 428 or a passivation layer is selectively deposited on the third patterned metal layer 424 and the fourth patterned metal layer 426.

In the same way as the first preferred embodiment and the second preferred embodiment, please note that the first patterned metal layer 418 and the second patterned metal layer 420 have the same pattern density or similar pattern density, and the third patterned metal layer 424 and the fourth patterned metal layer 426 have the same pattern density or similar pattern density in the third preferred embodiment of the present invention. Every patterned metal layer does not have a metal pattern with large superficial measure, and therefore, the rugged and rough problems can be prevented during a series of the metallizing processes and the planarization processes, and even when there are more metallizing processes and planarization processes afterward, the present invention multilevel interconnects still has a flat surface. Furthermore, patterns of the fourth patterned metal layer 426 and the second patterned metal layer 420 are interlacing, and are designed to stack and form a patterned metal layer with greater pattern density above the logical circuit area 404 as a shielding layer, and the logical circuit area 404 on the semiconductor substrate 420 is completely covered by the vertical projection superficial measure of the patterns of the fourth patterned metal layer 426 and the second patterned metal layer 420, wherein the patterns of the second patterned metal layer 420 and the fourth patterned metal layer 426 are interlaced without overlapping or are interlaced and partially overlapping. The first patterned metal layer 418 and the third patterned metal layer 424 are completely overlapped to cover the insulators 412 entirely and expose the light sensitization devices 414 only. In addition, considering other better light shielding effects, as shown in FIG. 12, the patterns of the fourth patterned metal layer 426 and the second patterned metal layer 420 also can be designed as being dense inside and sparse outside, i.e. the patterns of the fourth patterned metal layer 426 and the second patterned metal layer 420 close to the pixel array area 402 have higher pattern density, and the patterns of the fourth patterned metal layer 426 and the second patterned metal layer 420 far from the pixel array area 402 have lower pattern density, or, the patterns of the fourth patterned metal layer 426 and the second patterned metal layer 420 close to the pixel array area 402 can be interlaced and partially overlapping, and the patterns of the fourth patterned metal layer 426 and the second patterned metal layer 420 far from the pixel array area 402 can be interlaced without overlapping, in order to attain a better light shielding effect.

Furthermore, between the first metallizing process and the second metallizing process in every preferred embodiment of the present invention, additional metallizing processes such as a third metallizing process and a fourth metallizing process, etc. can be performed before the second metallizing process or after the second metallizing process to satisfy the requirements of various situations or different products. In addition, miscellaneous permutations and combinations of different metallizing processes such as copper metallizing process and aluminum metallizing process can be utilized in the present invention to fabricate the structure of multilevel interconnects, and not limited to the three preferred embodiments mentioned above.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating multilevel interconnects with shielding function comprising:
    providing a substrate, a pixel array area and a logical circuit area defined on the substrate surface;
    forming a first dielectric layer on the substrate;
    performing a first metallizing process on the first dielectric layer to form a first patterned metal layer and a second patterned metal layer above the pixel array area and the logical circuit area respectively, wherein the second patterned metal layer comprises a plurality of first blocks positioned individually above the logical circuit area;
    forming a second dielectric layer on the first patterned metal layer, the second patterned metal layer, and the first dielectric layer;
    performing a second metallizing process on the second dielectric layer to form a third patterned metal layer and a fourth patterned metal layer above the pixel array area and the logical circuit area respectively, wherein the fourth patterned metal layer comprises a plurality of second blocks positioned individually above the logical circuit area, and interlacing with the first blocks to completely cover the logical circuit area; and
    depositing a planarized dielectric layer on the third patterned metal layer and the fourth patterned metal layer.

2. The method of claim 1 wherein the first patterned metal layer and the second patterned metal layer have the same pattern density or similar pattern density.

3. The method of claim 1 wherein the third patterned metal layer and the fourth patterned metal layer have the same pattern density or similar pattern density.

4. The method of claim 1 wherein the first metallizing process further comprises:
    etching the first dielectric layer to form a first pattern area and a second pattern area in the first dielectric layer above the pixel array area and the logical circuit area respectively;
    forming a first metal layer on the first dielectric layer; and
    performing a first planarization process on the first metal layer and the first dielectric layer to form a first patterned metal layer and a second patterned metal layer on the first pattern area and the second pattern area respectively.

5. The method of claim 1 wherein the second metallizing process further comprises:

etching the second dielectric layer to form a third pattern area and a fourth pattern area in the second dielectric layer above the pixel array area and the logical circuit area respectively;

forming a second metal layer on the second dielectric layer; and performing a second planarization process on the second metal layer and the second dielectric layer to form a third patterned metal layer and a fourth patterned metal layer on the third pattern area and the fourth pattern area respectively.

6. The method of claim 4 wherein the first planarization process comprises a chemical mechanical polishing process or an etching process.

7. The method of claim 5 wherein the second planarization process comprises a chemical mechanical polishing process or an etching process.

8. The method of claim 1 wherein the first metallizing process further comprises:

forming a first metal layer on the first dielectric layer; and etching the first metal layer to form a first patterned metal layer and a second patterned metal layer above the pixel array area and the logical circuit area respectively.

9. The method of claim 1 further comprising a step of performing a planarization process on the second dielectric layer.

10. The method of claim 1 wherein the second metallizing process further comprises:

forming a second metal layer on the second dielectric layer; and etching the second metal layer to form a third patterned metal layer and a fourth patterned metal layer above the pixel array area and the logical circuit area respectively.

11. The method of claim 1 wherein the pixel array area comprises a plurality of optical component areas and a plurality of shallow trench areas, and patterns of the first patterned metal layer and the third patterned metal layer are completely overlapped to cover the shallow trench areas entirely and expose the optical component areas only.

12. The method of claim 1 wherein the patterns of the second patterned metal layer and the fourth patterned metal layer are interlaced without overlapping to stack and form a patterned metal layer with greater pattern density, and cover the logical circuit area entirely.

13. The method of claim 1 wherein the first blocks and the second blocks are interlaced and partially overlapping to stack and form a greater pattern density, and cover the logical circuit area entirely.

14. The method of claim 1 wherein the first metal layer and the second metal layer comprise copper or aluminum.

15. The method of claim 1 wherein the third metal layer and the fourth metal layer comprise copper or aluminum.

16. The method of claim 1 wherein the first blocks are isolated from each other and the second blocks are isolated from each other.

17. A structure of multilevel interconnects with shielding function comprising:

a substrate with a pixel array area and a logical circuit area on the substrate surface;

a first dielectric layer positioned on the substrate;

a first patterned metal layer positioned on the first dielectric layer and above the pixel array area on the substrate surface;

a second patterned metal layer positioned on the first dielectric layer and above the logical circuit area on the substrate surface, wherein the second patterned metal layer comprises a plurality of first blocks positioned individually above the logical circuit area;

a second dielectric layer positioned on the first patterned metal layer, the second patterned metal layer, and the first dielectric layer;

a third patterned metal layer positioned on the second dielectric layer and above the pixel array area on the substrate surface;

a fourth patterned metal layer positioned on the second dielectric layer and above the logical circuit area on the substrate surface, wherein the fourth patterned metal layer comprises a plurality of second blocks positioned individually above the logical circuit area and interlacing with the first blocks to completely cover the logical circuit area; and a planarized dielectric layer positioned on the third patterned metal layer and the fourth patterned metal layer.

18. The structure of claim 17 wherein the first patterned metal layer and the second patterned metal layer have the same pattern density or similar pattern density.

19. The structure of claim 17 wherein the third patterned metal layer and the fourth patterned metal layer have the same pattern density or similar pattern density.

20. The structure of claim 17 wherein the pixel array area comprises a plurality of optical component areas and a plurality of shallow trench areas, and patterns of the first patterned metal layer and the third patterned metal layer are completely overlapped to cover the shallow trench areas entirely and expose the optical component areas only.

21. The structure of claim 17 wherein the patterns of the second patterned metal layer and the fourth patterned metal layer are interlaced without overlapping to stack and form a patterned metal layer with greater pattern density, and cover the logical circuit area entirely.

22. The structure of claim 17 wherein the first blocks and the second blocks are interlaced and partially overlapping to stack and form a greater pattern density, and cover the logical circuit area entirely.

23. The structure of claim 17 wherein the first metal layer and the second metal layer comprise copper or aluminum.

24. The structure of claim 17 wherein the third metal layer and the fourth metal layer comprise copper or aluminum.

25. The method of claim 17 wherein the first blocks are isolated from each other and the second blocks are isolated from each other.

* * * * *